(12) United States Patent
Liu et al.

(10) Patent No.: US 10,497,786 B2
(45) Date of Patent: Dec. 3, 2019

(54) MANUFACTURING METHOD OF SEMICONDUCTOR DEVICE

(71) Applicant: Winbond Electronics Corp., Taichung (TW)

(72) Inventors: Chung-Hsien Liu, Taichung (TW); Chun-Hsu Chen, Taichung (TW); Lu-Ping Chiang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/112,780

(22) Filed: Aug. 27, 2018

(65) Prior Publication Data

US 2019/0088486 A1 Mar. 21, 2019

(30) Foreign Application Priority Data

Sep. 20, 2017 (CN) .......................... 2017 1 0849461

(51) Int. Cl.
| | |
|---|---|
| *H01L 29/40* | (2006.01) |
| *H01L 21/28* | (2006.01) |
| *H01L 21/762* | (2006.01) |
| *H01L 29/423* | (2006.01) |
| *H01L 27/11521* | (2017.01) |
| *H01L 29/788* | (2006.01) |

(52) U.S. Cl.
CPC .. *H01L 29/40114* (2019.08); *H01L 21/76224* (2013.01); *H01L 27/11521* (2013.01); *H01L 29/42324* (2013.01); *H01L 29/788* (2013.01)

(58) Field of Classification Search
CPC ......... H01L 29/42324; H01L 29/40114; H01L 29/788–7888; H01L 21/3081; H01L 27/11521; H01L 27/11517; G11C 2216/06–10
See application file for complete search history.

(56) References Cited

U.S. PATENT DOCUMENTS

| 7,595,522 B2* | 9/2009 | Takeuchi | .............. | H01L 27/115 257/288 |
|---|---|---|---|---|
| 7,915,124 B2 | 3/2011 | Kai et al. | | |

(Continued)

FOREIGN PATENT DOCUMENTS

| CN | 101359694 | 2/2009 |
|---|---|---|
| TW | 201630164 | 8/2016 |

*Primary Examiner* — Joseph C. Nicely
(74) *Attorney, Agent, or Firm* — JCIPRNET

(57) ABSTRACT

A manufacturing method of a semiconductor device includes the following steps. A first conductive layer, a first oxide layer, and a hardmask layer are sequentially formed on a substrate. The hardmask layer and the first oxide layer are patterned to form a stacking structure including a hardmask pattern and a first oxide pattern. An oxidation process is performed, such that a second oxide layer is formed on surfaces of the stacking structure and the first conductive layer, and a region of the first conductive layer adjacent to a sidewall of the stacking structure are oxidized to form an extending oxide pattern. The second oxide layer is removed. The stacking structure is applied as a mask to remove an exposed portion of the first conductive layer and the substrate therebelow, such that a first conductive structure and a recess in the substrate are formed. The stacking structure is removed. The extending oxide pattern is removed.

11 Claims, 10 Drawing Sheets

(56) References Cited

U.S. PATENT DOCUMENTS

| | | | |
|---|---|---|---|
| 8,581,322 B2* | 11/2013 | Lu | H01L 29/40114 |
| | | | 257/315 |
| 2007/0012990 A1* | 1/2007 | Osari | H01L 27/115 |
| | | | 257/315 |
| 2008/0003750 A1 | 1/2008 | Kim et al. | |
| 2008/0171406 A1* | 7/2008 | Orimoto | H01L 27/115 |
| | | | 438/129 |
| 2010/0308393 A1 | 12/2010 | Matsuo et al. | |
| 2011/0121382 A1* | 5/2011 | Chakihara | G11C 16/0466 |
| | | | 257/326 |
| 2011/0169068 A1* | 7/2011 | Lee | H01L 27/11521 |
| | | | 257/321 |
| 2014/0209990 A1* | 7/2014 | Lu | H01L 23/48 |
| | | | 257/315 |
| 2014/0225179 A1* | 8/2014 | Aoyama | H01L 29/42324 |
| | | | 257/316 |
| 2015/0171223 A1* | 6/2015 | Liao | H01L 29/7883 |
| | | | 257/321 |
| 2015/0188045 A1 | 7/2015 | Wang et al. | |

* cited by examiner

MANUFACTURING METHOD OF SEMICONDUCTOR DEVICE

CROSS-REFERENCE TO RELATED APPLICATION

This application claims the priority benefit of China application serial no. 201710849461.X, filed on Sep. 20, 2017. The entirety of the above-mentioned patent application is hereby incorporated by reference herein and made a part of this specification.

BACKGROUND OF THE INVENTION

Field of the Invention

This invention relates to a manufacturing method of a semiconductor device, particularly a manufacturing method of a memory device.

Description of Related Art

As integrated circuits are developed to have a higher integration density, a distance between adjacent active areas of flash memories is reduced. In other words, an aspect ratio (depth-width ratio) of the openings between adjacent floating gates is increased, such that seams and voids are more likely to be formed between adjacent floating gates when a control gate is formed over the floating gates and between adjacent floating gates. As a result, a side etching is likely to occur when the control gate is being patterned and a gate-coupling ratio (GCR) between the floating gates and the control gate is thus reduced.

SUMMARY OF THE INVENTION

A manufacturing method of a semiconductor device is provided in this invention. Formation of seams and voids when a control gate is being filled into a recess between floating gates is avoided.

The manufacturing method of semiconductor device includes the following steps. A first conductive layer, a first oxide layer, and a hardmask layer are sequentially formed on a substrate. The hardmask layer and the first oxide layer are patterned, such that a stacking structure including a hardmask pattern and a first oxide pattern is formed. An oxidation process is performed, such that a second oxide layer is formed on surfaces of the stacking structure and the first conductive layer. A region of the first conductive layer adjacent to a sidewall of the stacking structure is oxidized, such that an extending oxide pattern is formed. The second oxide layer is removed. An exposed portion of the first conductive layer of the first conductive layer and the substrate below the exposed portion of the first conductive layer are removed by applying the stacking structure applied as a mask, such that a first conductive structure is formed and a recess is formed in the substrate. The stacking structure is removed. The extending oxide pattern is removed.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
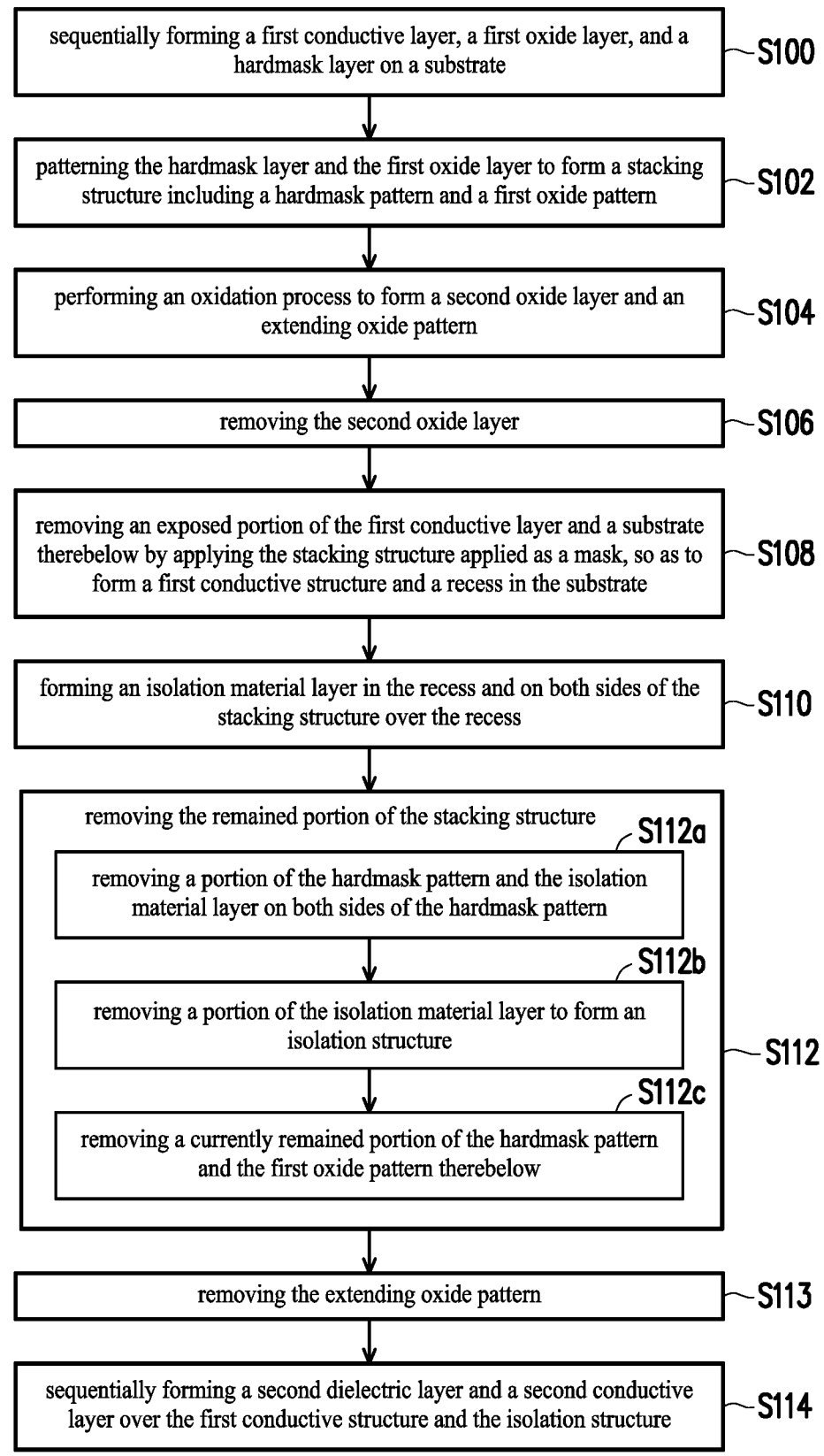
FIG. 1 is a flowchart of a manufacturing method of a semiconductor device according to an embodiment of the invention.
Figure 2A:
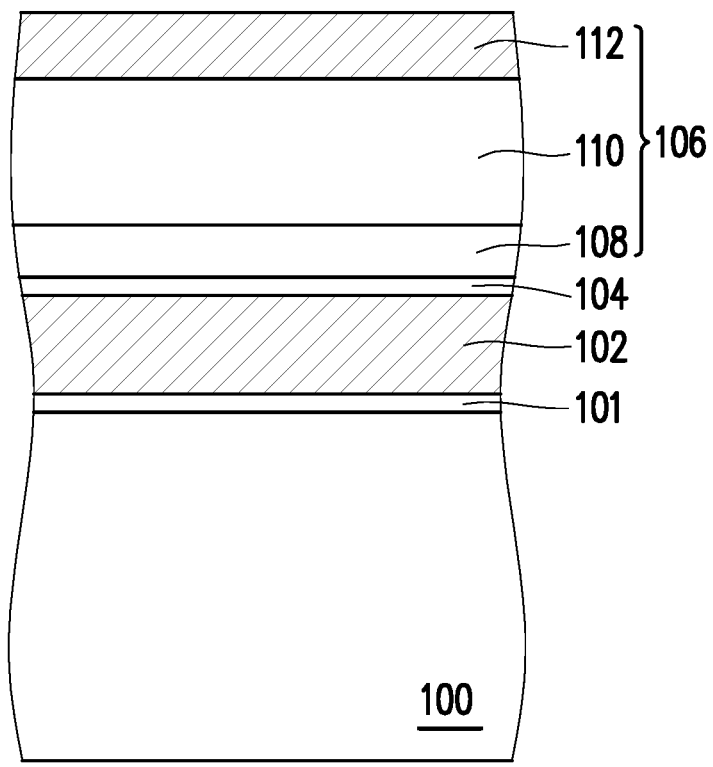
FIGS. 2A to 2I are cross-sectional views of a manufacturing process of the semiconductor device according to an embodiment of the invention.

Referring to FIG. 1 and FIG. 2A, a manufacturing method of a memory device according to an embodiment of the invention may include the following steps. For example, the memory device may be a flash memory. First, a step S100 is performed, in which a first conductive layer 102, a first oxide layer 104, and a hardmask layer 106 are sequentially formed on a substrate 100.

A material of the first conductive layer 102 may include doped or undoped polysilicon. A method of forming the first conductive layer 102 may include a chemical vapor deposition (CVD) method. A thickness of the first conductive layer 102 may range from 70 nm to 100 nm. A material of the first oxide layer 104 may include silicon oxide or silicon oxynitride. A method of forming the first oxide layer 104 may include a thermal oxidation method, a chemical vapor deposition method, or a combination thereof. A thickness of the first oxide layer 104 may range from 5 nm to 15 nm. In some embodiments, the hardmask layer 106 may be a multi-layered structure. For example, the hardmask layer 106 may include a hardmask layer 108, a hardmask layer 110, and a hardmask layer 112 sequentially stacked on the substrate 100. Materials of the hardmask layer 108, the hardmask layer 110, and the hardmask layer 112 may be selected to have an etching selectivity with respect to each other. For example, a material of the hardmask 108 may include silicon nitride or silicon oxynitride. A material of the hardmask layer 110 may include silicon oxide. A material of the hardmask layer 112 may include polysilicon. In other embodiments, the hardmask layer 106 may be a single-layered structure, and a material of the hardmask layer 106 may include silicon oxide, silicon nitride, or silicon oxynitride. A method of forming the hardmask layer 106 may include a chemical vapor deposition method.

Before the step S100 is performed, a first dielectric layer 101 may be formed on the substrate 100. A material of the first dielectric layer 101 may include silicon oxide or a high-k dielectric material (of which a dielectric constant is, for example, greater than 4). For example, the high-k dielectric material may include hafnium oxide, hafnium silicon oxide, hafnium aluminum oxide, or hafnium tantalum oxide. A thickness of the first dielectric layer 101 may range from 3 nm to 10 nm.

Figure 2B:
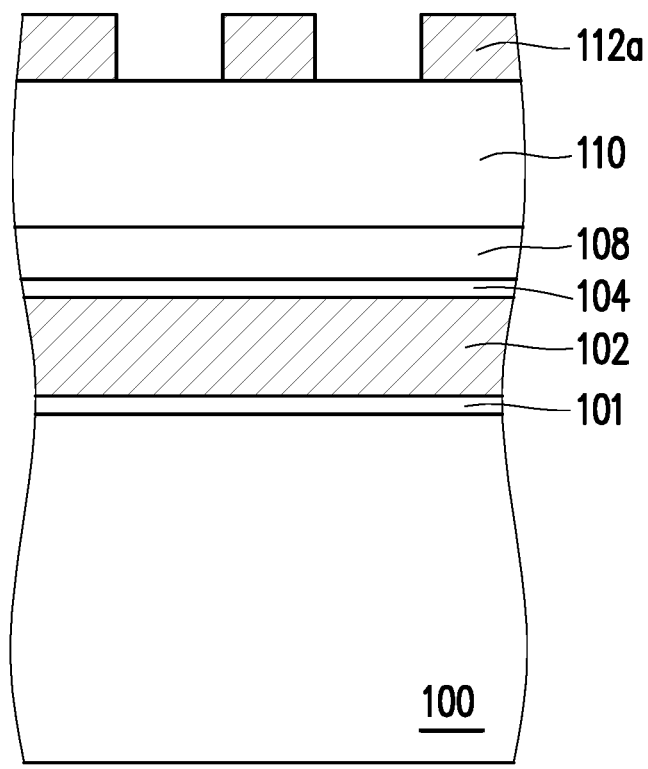
Figure 2C:
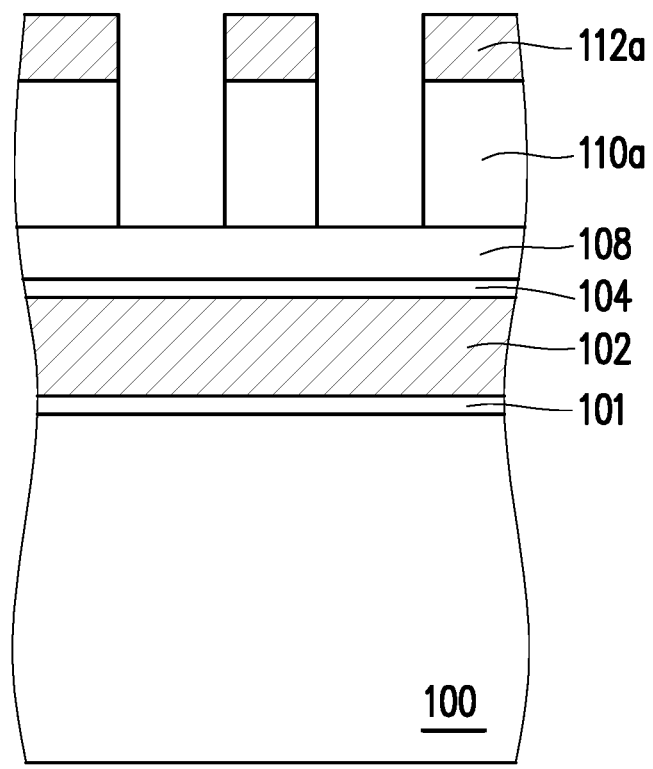
Figure 2D:
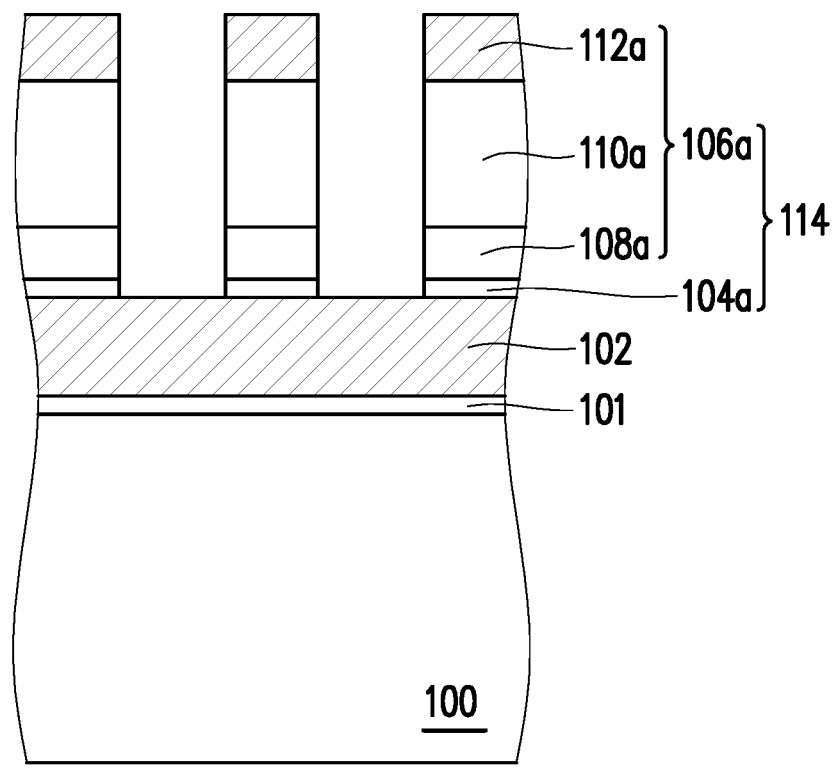

Referring to FIG. 1 and FIGS. 2B to 2D, a step S102 is performed, in which the hardmask layer 106 and the first oxide layer 104 are patterned, such that a stacking structure 114 including a hardmask pattern 106a and a first oxide pattern 104a is formed. In some embodiments, the hardmask layer 106 is a multi-layered structure. In addition, the step of patterning the multi-layered structure of the hardmask layer 106 may include a plurality of sub-steps. For example, the hardmask layer 106 including the hardmask layer 108, the hardmask layer 110, and the hardmask layer 112 may be patterned via a plurality of sub-steps, such that a hardmask pattern 106a including a hardmask pattern 108a, a hardmask pattern 110a, and a hardmask pattern 112a is formed. Referring to FIGS. 2B and 2C, a method of patterning the hardmask layer 106 by the sub-steps may include patterning the hardmask layer 112, then removing an exposed portion of the hardmask layer 110 via applying the hardmask pattern 112a as a mask. Referring to FIG. 2D, then an exposed portion of the hardmask layer 108 and an exposed portion of the first oxide layer 104 are removed by applying the hardmask pattern 112a and the hardmask pattern 110a as masks, such that a stacking structure 114 is formed. In other embodiments, the hardmask layer 106 may otherwise be a single-layered structure. A method of partially removing the hardmask layer 106 and the first oxide layer 104 may include an anisotropic etching, such as a dry etching. In addition, the first conductive layer 102 may serve as an etching stop layer when a portion of the first oxide layer 104 is being removed.

Figure 2E:
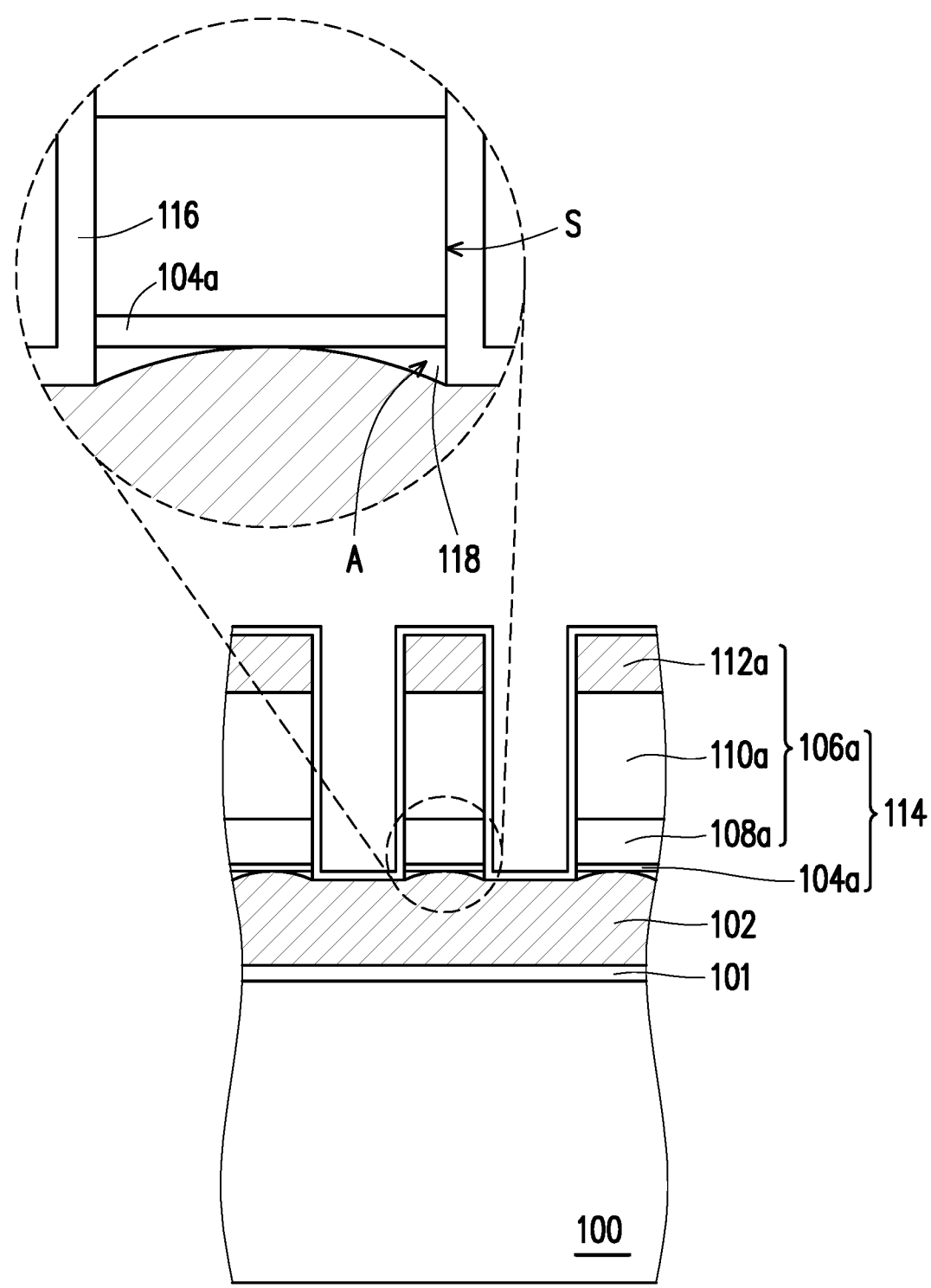

Referring to FIG. 1 and FIG. 2E, a step S104 is performed, in which an oxidation process is performed, such that a second oxide layer 116 and an extending oxide pattern 118 are formed. In the step S104, the second oxide layer 116 is formed on surfaces of the stacking structure 114 and the first conductive layer 102. A thickness of the second oxide layer 116 may range from 10 nm to 12 nm. Since the first conductive layer 102 may serve as an etching stop layer in the step S102, an interface between the first conductive layer 102 and the first oxide pattern 104a can be exposed. Hence, when the oxidation process of the step S104 is performed, oxygen can diffuse to an interface between the first conductive layer 102 and the stacking structure 114. As a result, a region A of the first conductive layer 102 adjacent to a sidewall S of the stacking structure 114 is oxidized into the extending oxide pattern 118. A thickness of the extending oxide pattern 118 may gradually decrease toward a direction away from the sidewall S of the stacking structure 114. In some embodiments, an interface between the extending oxide pattern 118 and an un-oxidized portion of the first conductive layer 102 may be formed into a curved plane. Particularly, an opening of the curved plane faces the first conductive layer 102. In addition, a curvature of the curved plane may be altered through adjusting an operation time of the oxidation process. Generally, the thickness of the extending oxide pattern 118 and the curvature of the curved plane increase as the operation time of the oxidation process increases. In other embodiments, an interface between the extending oxide pattern 118 and the first conductive layer 102 may be formed into an inclined plane. In a similar manner, a slope of the inclined plane may be increased by extending the operation time of the oxidation process.

In some embodiments, the oxidation process in the step S104 may include an in-situ steam generation (ISSG) method. The second oxide layer 116 and the extending oxide pattern 118 can be formed in a short period of time by applying the in-situ steam generation method. Hence, a thermal budget for the manufacturing method of a semiconductor device 20 is reduced. For example, an operation time of the in-situ steam generation method may range from 1 second to 10 seconds. In addition, an operation temperature of the in-situ steam generation method may range from 900° C. to 1200° C., and a ratio of nitrogen to oxygen of the in-situ steam generation method may range from 0.30 to 0.35.

Figure 2F:
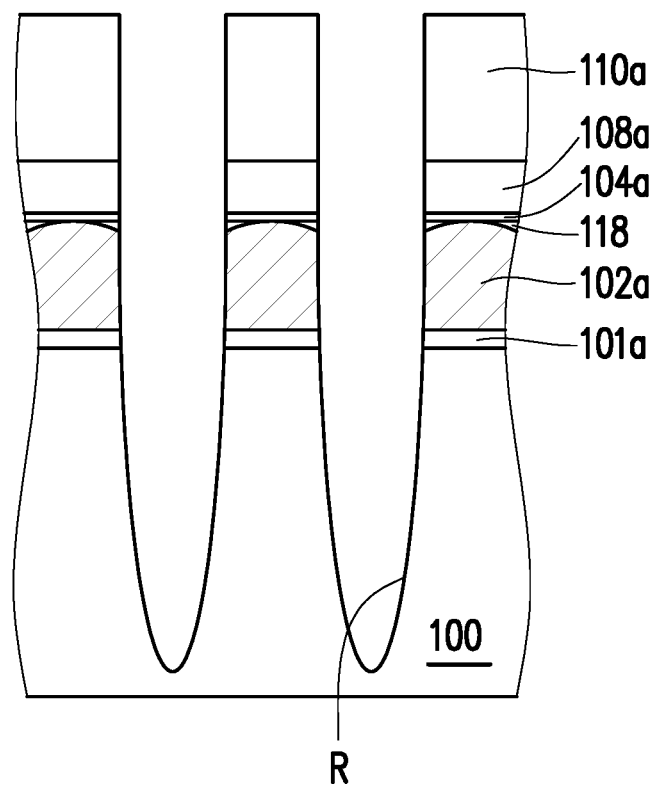

Referring to FIG. 1 and FIG. 2F, a step S106 is performed, in which the second oxide layer 116 is removed. A method of removing the second oxide layer 116 may include an isotropic etching, such as a wet etching. A step S108 is performed, in which an exposed portion of the first conductive layer 102 and the substrate 100 below the exposed portion of the first conductive layer 102 are removed by applying the stacking structure 114 as a mask, such that a first conductive structure 102a is formed, and a recess R is formed in the substrate 100. In some embodiments, the hardmask pattern 112a in the stacking structure 114 may be simultaneously removed in the step S108. The first conductive structure 102a may serve as a floating gate in the semiconductor device 20 of FIG. 2I. An area between adjacent recesses R may serve as an active area of the semiconductor device 20. In addition, the first dielectric layer 101 may be patterned to form a first dielectric pattern 101a in the step S108. The first dielectric pattern 101a may serve as a tunneling oxide layer of the semiconductor device 20.

In other embodiments, the step S106 and the step S108 may be performed simultaneously. In other words, the second oxide layer 116, a portion of the first conductive layer 102 exposed by the stacking structure 114, and the substrate 100 below the exposed portion of the first conductive layer 102 may be removed in the same step by selecting a proper etchant.

Figure 2G:
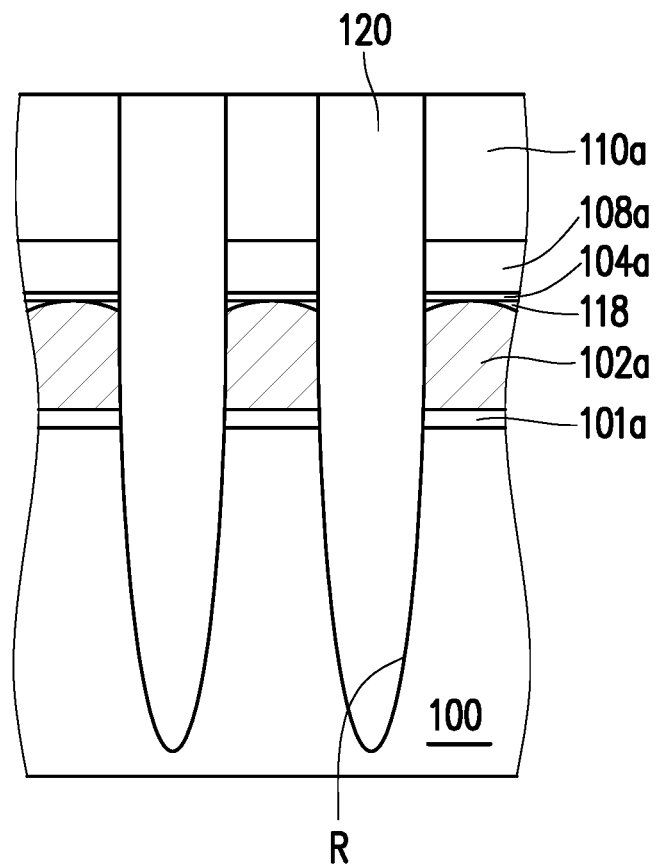

Referring to FIG. 1 and FIG. 2G, a step S110 is performed, in which an isolation material layer 120 is formed in the recess R in the substrate 100 and on both sides of the first conductive structure 102a over the recess R. In some embodiments, the isolation material layer 120 may be formed to extend up to both sides of the hardmask pattern 110a or protrude from a top surface of the hardmask pattern 110a. A material of the isolation material layer 120 may include an insulation material, such as silicon oxide, silicon nitride, or a combination thereof. A method of forming the isolation material layer 120 may include a chemical vapor deposition method.

Figure 2H:
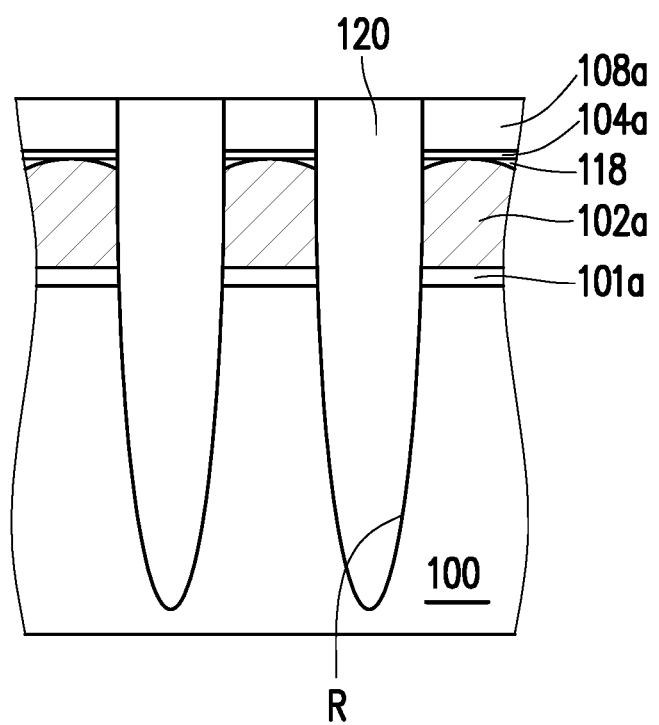
Figure 2I:
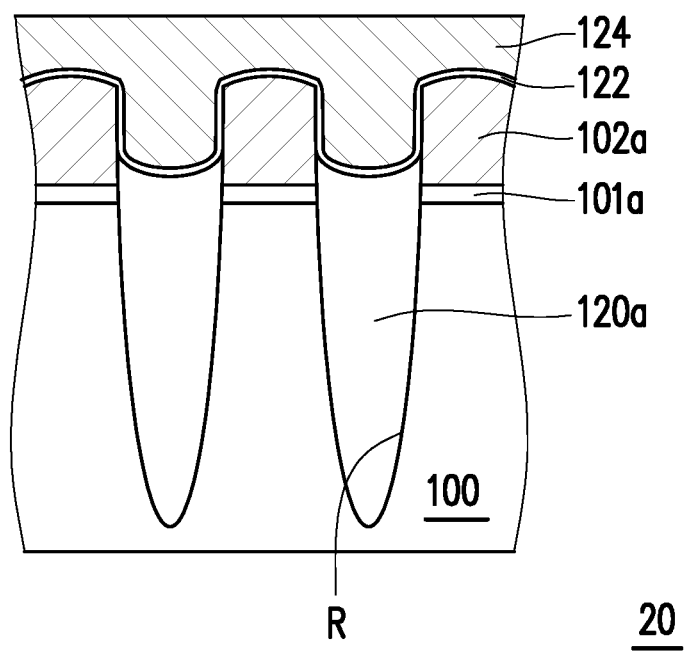

Referring to FIG. 1, FIG. 2H, and FIG. 2I, a step S112 is performed, in which the remained portion of the stacking structure 114 is removed. The step S112 may further include removing a portion of the isolation material layer 120, such that an isolation structure 120a is formed. In some embodiments, the step S112 may include the following sub-steps S112a to S112c.

Referring to FIG. 1 and FIG. 2H, the sub-step S112a is performed, in which a portion of the hardmask pattern 106a and the isolation material layer 120 on both sides of the portion of the hardmask pattern 106a are removed. For example, the hardmask pattern 110a and the isolation material layer 120 on both sides of the hardmask pattern 110a may be removed. In some embodiments, the sub-step S112a may be performed through a chemical mechanical polishing method.

Referring to FIG. 1 and FIG. 2I, the sub-step S112b is performed, in which a portion of the isolation material layer 120 is removed, such that an isolation structure 120a is formed. In some embodiments, a top surface of the isolation structure 120a maybe be formed to be lower than a top surface of the first conductive structure 102a, such that a gate-coupling ratio of the first conductive structure 102a (serving as a floating gate) with respect to a later-formed second conductive layer 124 (serving as a control gate) may be increased. In addition, the top surface of the isolation structure 120a may be formed to be higher than a top surface of the first dielectric pattern 101a. As a result, the first dielectric pattern 101a can be avoided from being damaged when the isolation structure 120a is formed. A method of removing a portion of the isolation material layer 120 includes an anisotropic etching, such as a dry etching.

The sub-step S112c is performed, in which a currently remained portion of the hardmask pattern 106a and the first oxide pattern 104a therebelow are removed. In some embodiments, the currently remained portion of the hardmask pattern 106a may be the hardmask pattern 108a. A method of removing the hardmask pattern 108a and the first oxide pattern 104a below the hardmask pattern 108a includes an isotropic etching, such as a wet etching.

A step S113 is performed, in which the extending oxide pattern 118 is removed. In some embodiments, a method of removing the extending oxide pattern 118 includes an isotropic etching, such as a wet etching. Since the interface between the extending oxide pattern 118 and the first conductive layer 102 is formed to be a curved plane or an inclined plane in the step S104, the exposed portion of the first conductive structure 102a after the extending oxide pattern 118 is removed has a rounded corner or a chamfered corner.

The embodiment shown in FIG. 2F to FIG. 2H presents that the second oxide layer 116 and the extending oxide pattern 118 are respectively removed in different steps (the step S106 and the step S113). In other embodiments, however, the second oxide layer 116 and the extending oxide pattern 118 may otherwise be removed simultaneously in the step S106. In yet other embodiments, the step S106, the step S108, and the step S113 may even be performed simultaneously. In other words, the second oxide layer 116, a portion of the first conductive layer 102, a portion of the substrate 100, and the extending oxide pattern 108 may be simultaneously etched by selecting a proper etchant.

A step S114 is performed, in which a second dielectric layer 112 and a second conductive layer 124 are sequentially formed over the first conductive structure 102a and the isolation structure 120a. The second conductive layer 124 may serve as a control gate of the semiconductor device 20, and the second dielectric layer 122 may serve as an intergate dielectric layer of the semiconductor device 20. In some embodiments, a material of the second conductive layer 124 may include polysilicon, metal, metal silicide, or other conductive materials. For example, the metal may include titanium, tantalum, tungsten, aluminum, or zirconium. The metal silicide may include nickel silicide, titanium silicide, or tungsten silicide. The second dielectric layer 122 may be a single-layered structure or a multi-layered structure. A material of the second dielectric layer 122 may include silicon oxide, silicon nitride, or a combination thereof. For example, the second dielectric layer 122 may be an ONO structure, i.e., a silicon oxide/silicon nitride/silicon oxide structure. To this point, the manufacturing of the semiconductor device 20 of this embodiment has been completed.

In conclusion of the above, the extending oxide pattern is formed by oxidizing the region of the first conductive layer adjacent to the sidewall of the stacking structure, such that the interface between the first conductive layer and the extending oxide pattern is formed to be an inclined plane or a curved plane. As a result, the top surface of the first conductive structure can have a rounded corner or a chamfered corner after the first conductive layer is patterned and the extending oxide pattern is removed. Hence, formation of seams and voids between adjacent first conductive structures can be avoided when the second conductive layer is formed between adjacent first conductive structures and over the first conductive structures. As a result, a decrease of the gate-coupling ratio resulted from a following side etching can be avoided when the second conductive layer is patterned. In addition, the first conductive structure having the rounded corner or chamfered corner can further avoid the problem of point discharge, thus a leakage current of the semiconductor device can be reduced. Moreover, the manufacturing method of the semiconductor device of the present embodiment may allow the first conductive structure to have the rounded corner or chamfered corner without performing an anisotropic etching on the first conductive structure. Therefore, the first conductive structure can be avoided from being damaged by plasma when the anisotropic etching is performed on the first conductive structure.

In some embodiments, the method of oxidizing a region of the first conductive layer may include the in-situ steam generation (ISSG) method, which can be completed in a short period of time. Hence, a thermal budget for the manufacturing method of the semiconductor device may be reduced. In other words, an influence of thermal energy on the semiconductor device may be reduced. In addition, a curvature of the rounded corner or a slope of the chamfered corner of the first conductive structure may be simply adjusted through altering an operation time of the in-situ steam generation method.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A manufacturing method of a semiconductor device comprising:
    sequentially forming a first conductive layer, a first oxide layer, and a hardmask layer on a substrate;
    patterning the hardmask layer and the first oxide layer to form a stacking structure comprising a hardmask pattern and a first oxide pattern;
    performing an oxidation process to form a second oxide layer on surfaces of the stacking structure and the first conductive layer, wherein a region of the first conductive layer adjacent to a sidewall of the stacking structure is oxidized to form an extending oxide pattern;
    removing the second oxide layer;
    removing an exposed portion of first conductive layer and a substrate below the exposed portion of the first conductive layer by applying the stacking structure applied as a mask, so as to form a first conductive structure and a recess in the substrate;
    removing the stacking structure; and
    removing the extending oxide pattern.

2. The manufacturing method of the semiconductor device of claim 1, wherein a thickness of the extending oxide pattern gradually decreases toward a direction away from the sidewall of the stacking structure.

3. The manufacturing method of the semiconductor device of claim 1, wherein an interface between the extending oxide pattern and the first conductive layer is an inclined plane or a curved plane.

4. The manufacturing method of the semiconductor device of claim 1, wherein the oxidation process comprises an in-situ steam generation method.

5. The manufacturing method of the semiconductor device of claim 4, wherein an operation time of the in-situ steam generation method ranges from 1 second to 10 seconds.

6. The manufacturing method of the semiconductor device of claim 4, wherein an operation temperature of the in-situ steam generation method ranges from 900° C. to 1200° C., and a ratio of nitrogen to oxygen of the in-situ steam generation method ranges from 0.30 to 0.35.

7. The manufacturing method of the semiconductor device of claim 1, further comprising forming a first dielectric layer on the substrate before the step of sequentially forming the first conductive layer, the first oxide layer, and the hardmask layer.

8. The manufacturing method of the semiconductor device of claim 1, wherein the hardmask layer is a multi-layered structure.

9. The manufacturing method of the semiconductor device of claim 1, further comprising forming an isolation material layer in the recess of the substrate and on both sides of the first conductive structure located over the recess before the step of removing the stacking structure and the extending oxide pattern.

10. The manufacturing method of the semiconductor device of claim 9, wherein the step of removing the stacking structure and the extending oxide pattern further comprises removing a portion of the isolation material layer to form an isolation structure, wherein a top surface of the isolation structure is lower than a top surface of the first conductive structure.

11. The manufacturing method of the semiconductor device of claim 10, further comprising sequentially forming a second dielectric layer and a second conductive layer over the first conductive structure and the isolation structure.

* * * * *